(12) United States Patent
Reykowski et al.

(10) Patent No.: US 6,710,597 B2
(45) Date of Patent: Mar. 23, 2004

(54) MAGNETIC RESONANCE TOMOGRAPHY APPARATUS AND METHOD FOR OPERATING SAME EMPLOYING AN ELECTROSTATIC RELAY

(75) Inventors: Arne Reykowski, Erlangen (DE); Jianmin Wang, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/119,854

(22) Filed: Apr. 10, 2002

(65) Prior Publication Data

US 2002/0180437 A1 Dec. 5, 2002

(30) Foreign Application Priority Data

Apr. 11, 2001 (DE) .......................... 10 118 195

(51) Int. Cl.[7] .................................. G01V 3/00
(52) U.S. Cl. ........................ 324/318; 324/322
(58) Field of Search ................ 324/318, 322, 324/309, 314, 319, 320; 128/653.5; 200/181

(56) References Cited

U.S. PATENT DOCUMENTS

| | | | |
|---|---|---|---|
| 4,480,162 A | 10/1984 | Greenwood | 200/181 |
| 5,144,243 A * | 9/1992 | Nakabayashi | 324/318 |
| 5,572,130 A | 11/1996 | Ratzel | 324/318 |
| 5,673,785 A | 10/1997 | Schlaak et al. | 200/245 |
| 5,841,278 A * | 11/1998 | Green et al. | 324/318 |
| 6,160,400 A | 12/2000 | Friedrich et al. | 324/322 |
| 6,373,007 B1 * | 4/2002 | Calcatera et al. | 200/181 |

FOREIGN PATENT DOCUMENTS

| | | |
|---|---|---|
| DE | 42 05 029 | 2/1993 |
| DE | 198 07 214 | 9/1999 |
| DE | 198 23 690 | 1/2000 |
| DE | 199 26 742 | 1/2000 |
| DE | 198 54 450 | 6/2000 |
| EP | 0 472 390 | * 2/1992 |

OTHER PUBLICATIONS

Only abstract is provided "Network and Distributed Systems Management," Sloman, Ed, (1994) pp. 303–347.

* cited by examiner

Primary Examiner—Diego Gutierrez
Assistant Examiner—Brij B. Shrivastav
(74) Attorney, Agent, or Firm—Schiff Hardin LLP

(57) ABSTRACT

An electrostatic relay is employed for switching in an electrical line system of a magnetic resonance tomography apparatus. The relay is employed for detuning a radio-frequency reception coil during a radio-frequency transmission phase of the nuclear magnetic resonance tomography apparatus.

36 Claims, 7 Drawing Sheets

MAGNETIC RESONANCE TOMOGRAPHY APPARATUS AND METHOD FOR OPERATING SAME EMPLOYING AN ELECTROSTATIC RELAY

BACKGROUND OF THE INVENTION

1. Field of the Invention

The present invention is directed to the use of a switch element for switching in an electrical line system of a magnetic resonance tomography apparatus, and to a magnetic resonance tomography apparatus of the type having a radio-frequency coil, particularly a radio-frequency reception coil, and with a switch element for influencing the coil activity.

2. Description of the Prior Art

Magnetic resonance tomography systems of the above type are know, as are magnetic resonance tomography systems having a number of radio-frequency transmission coils and a number of radio-frequency reception coils with at least one switch element for multiplexing control signals or for demultiplexing reception signals.

In a magnetic resonance tomography apparatus, radio-frequency pulses are emitted into the examination region of a subject or of a patient under examination in the presence of a uniform, time-constant basic magnetic field. During this transmission phase, a radio-frequency transmission coil is fed by a power amplifier. The radio-frequency transmission coil transmits at the Larmor frequency of the hydrogen nuclei that is typical for the basic field. As a consequence of the application of the radio-frequency pulse, an echo signal that can be received by a radio-frequency reception coil acting as antenna arises at a later point in time when the radio-frequency transmission pulse has already been deactivated. A raw data matrix is compiled from a number of radio-frequency echo signals that have been acquired with successive variation of an applied, gradient magnetic field. An image of the region under examination in the patient or subject is generated from this raw data matrix by Fourier transformation.

The radio-frequency transformation coil and the radio-frequency reception coil can be the same radio-frequency coil. In this case, the supply line of the radio-frequency coil must be switched back and forth between the power amplifier and a pre-amplifier serving the purpose of amplifying incoming echo signals, given each change between the transmission phase and the reception phase.

A number of radio-frequency reception coils can be present, for example a permanently installed reception coil, a local coil fashioned as a volume coil and/or a local coil fashioned as a surface coil. A single electronic reception channel can be present for these reception coils, so that a demultiplexing of the reception signals generated by the various reception coils is necessary.

In the case of the radio-frequency reception coil be separate from the radio-frequency transmission coil, it is necessary to detune the radio-frequency reception coil during the transmission phase, since the radio-frequency reception coil is likewise tuned to the Larmor frequency during the reception phase, because the radio-frequency reception coil would otherwise pick up power from the radiated radio-frequency field with high efficiency. This must be avoided in order to protect the patient. A known radio-frequency reception coil therefore has a detuning circuit. A PIN diode is integrated therein that activates the detuning circuit in the through-connected state, so that the radio-frequency reception coil is deactivated, i.e. detuned. The radio-frequency reception coil then can no longer receive.

The PIN diode in the detuning circuit acts as a fast, active switch element. A PIN diode, however, can act as a good switch only with low ON resistance when it is integrated for this purpose in the existing resonant circuit of the detuning circuit. In the through-connected condition of the PIN diode, the resonant circuit of the detuning circuit, which is tuned to the resonant frequency of the magnetic resonance tomograph (Larmor frequency), acts as a blocking circuit that minimizes the current in the radio-frequency reception coil acting as antenna in the transmission phase.

Conventional resonant detuning circuits of this type have the disadvantage that all of the voltage up to 500 V induced by the radio-frequency reception coil drops across the detuning circuit, so that an extremely high current flows in the blocking circuit during the transmission phase. This current—if only because of the magnetic field connected therewith—results in disturbances in the image acquisition in the nuclear magnetic resonance tomography apparatus.

SUMMARY OF THE INVENTION

An object of the present invention is to provide a switch element for employment in a magnetic resonance tomography apparatus that can be utilized in the frequency range of radio-frequency fields and that satisfies the switching times required in nuclear magnetic resonance tomography, and with which, in particular, the aforementioned disadvantages can be avoided or minimized.

A further object of the invention is to provide a magnetic resonance tomography apparatus having such a switch.

The object directed to a suitable switch element is inventively achieved by employing an electrostatic relay in an electrical line system of a magnetic resonance tomography apparatus.

The invention is based on the perception that an electrostatic relay is well suited for utilization in the presence of a strong magnetic field (constant magnetic basic field). An electrostatic relay operates largely free of current, so that interaction with the magnetic basic field does not occur. An electrostatic relay can be constructed without employing a coil whose magnetic field would be influenced by the basic field.

In contrast to a diode or a tube, that function as purely electronic switch elements, a relay is an electromechanical switch that can be electrically actuated but wherein the actual interrupt event occurs mechanically. The relay producing a completely galvanic separation. A relay can be implemented with an especially low ON resistance and with high dielectric strength in the radio-frequency range. Moreover, extremely short switching times can be achieved with the electrostatic relay. A PIN diode is a switch element that is voltage-stable at high frequencies and that would also be adequately fast for many purposes, however, this can only be utilized in a magnetic resonance apparatus by accepting the disadvantages that were set forth above.

An electrostatic relay can be utilized with particular advantages for employment in the uniform basic field of a magnetic resonance tomography apparatus preferably is arranged in the region of this basic field.

In a preferred version of the inventive method, a micromechanical relay is employed as relay, this being preferably at least partially manufactured with a material erosion technique, for example by etching, from a substrate, particularly a silicon substrate. Such a micro-mechanical relay can, for example, have a structural height in the range of 0.5 nm through approximately 1 mm that lies in the range of the thickness of typical silicon wafers. Moreover, the advantage is achieved that a micro-mechanical electrostatic relay can implement especially fast switching events, since the masses to be moved and, thus, the forces of inertia that occur are small. The distance over which the mass must be moved also is small.

German OS 32 07 920, corresponding to U.S. Pat. No. 4,480,162, discloses a micro-mechanical electrostatic relay for telephone systems that is suitable for the inventive employment. The inventively employed electrostatic relay has, in particular, a carrier part composed of a material having an electrically insulating effect that forms a carrier member and a structural unit with the carrier member and has an armature secured in articulated fashion to the carrier that carries at least one electrical contact. The teachings of German OS 32 07 920 and U.S. Pat. No. 4,480,162 are incorporated herein by reference.

A micro-mechanical electrostatic relay that can be employed for the purpose of the invention is disclosed in German PS 42 05 029. This relay has at least one armature that is elastically pivotably connected to a carrier at one side, the free end thereof carrying at least one contact piece and having at least one first electrically conductive layer. Further, the relay has at least one cooperating plate with at least a second electrically conductive layer and at least one cooperating contact piece that interacts with the contact piece of the armature. The two layers lying opposite one another are insulated from each other and can be connected to opposite polarities as of a voltage source. The armature is moved given application of a voltage to the layers acting as electrodes, so that the free end of the armature with the contact piece comes into contact with the cooperating contact piece, whereby the desired electrical connection is produced. The teachings of German PS 42 05 029 are incorporated herein by reference.

The carrier member or the substrate in the electrostatic relay is preferably fabricated of silicon, which exhibits an adequately high insulating resistance despite its semi-conducting properties and is consequently employed as material having an electrically insulating effect in the relay. Silicon has extraordinary good mechanical properties and can be easily micro-structured using known material erosion methods.

Further types of micro-mechanical electrostatic relays are disclosed in German PS 44 37 259 (corresponding to U.S. Pat. No. 5,673,785), German OS 198 54 450, German OS 198 07 214 as well as in German PS 198 23 690. These relays are likewise suitable for employment in a high magnetic field of a magnetic resonance tomography apparatus.

In another preferred embodiment, the electrostatic relay employed in the line system of the magnetic resonance tomography apparatus is constructed without ferromagnetic materials, i.e. its magnetic permeability is especially low. Instead of employing silicon, the substrate or the carrier member and/or a housing-forming cooperating member can be fabricated of a ceramic or of glass, particularly of Pyrex® glass. The layer electrodes producing the electrostatic attraction are preferably manufactured of gold or of a gold alloy. The non-ferromagnetic structure of the electrostatic relay has the particular advantage for utilization in a magnetic resonance tomograph that a disturbance of the uniform magnetic basic field and a disturbance of the radio-frequency transmission field, that is assumed to be uniform, are avoided. As a result, corresponding image artifacts are suppressed to a significant extent.

In another preferred embodiment, the electrostatic relay is employed to activate or deactivate a radio-frequency coil of the magnetic resonance tomography apparatus by switching the relay.

The radio-frequency coil activated or deactivated in this way is preferably a radio-frequency reception coil that, in particular, is deactivated by the switching before a radio-frequency pulse is transmitted into the subject to be imaged.

For example, the electrostatic relay can be utilized as an interrupt, as a multiplexer or as a demultiplexer or as a part thereof in an electrical high-frequency line leading to the radio-frequency coil.

The switching caused by the electrostatic relay is preferably employed for demultiplexing the reception signals of a number of radio-frequency reception coils. It is likewise preferred that this switching be utilized for multiplexing the control signals for a number of radio-frequency transmission coils.

In a preferred embodiment, the radio-frequency coil is detuned by the switching. This employment achieves a detuning circuit wherein the electrostatic relay serves as an active switch element.

The invention proceeds from the recognition that a conventionally employed detuning circuit as was initially described exhibits a number of disadvantages. In detail, these are:

a) The components of the detuning circuit must have high electrical strength with respect to the adjacent, induced voltage.

b) The components must also be power-resistant because of the high circuit current.

c) The induced current leads to an unwanted local disturbance of the radio-frequency transmission field that is ideally assumed to be homogeneous.

d) In worst case scenarios, the radiated radio-frequency transmission field can interfere at specific points in space with the field that is excited by the current induced in the blocking circuit. Local field elevations resulting therefrom could occur within the patient under examination, so that the risk of an excessively high introduction of eddy currents and, the associated risk of an upper transgression of the locally allowed, specific absorption ratio SAR, would exist.

f) Since the detuning circuit is exactly tuned to the Larmor frequency of the magnetic resonance tomograph, there is a risk of coupling the detuning circuit with other resonant structures that are allocated to the radio-frequency reception coil (for example, further detuning circuits, sheath wave inhibitors) or there is a risk of coupling with other radio-frequency reception coils that are not detuned.

g) Given a fault of a component at the PIN diode and given simultaneous failure of other safety precautions, it could occur that the radio-frequency reception coil is not detuned and that this is not recognized. In this case, melt fuses must be installed into the radio-frequency reception coil circuit as ultimate patient protection. Such fuses, however, have an unwanted negative influence on the image quality due to their finite electrical resistance.

h) The detuning circuit with a PIN diode requires much space, particularly because the inductance (coil)

employed therein must have adequate quality as well as adequate current and voltage strength.

The invention is also based on the consideration that electromagnetic relays are not adequately fast for solving the problem initially cited and are thus hardly suitable therefor.

In conjunction with the detuning circuit, the invention is based on the consideration that a switch element suitable for the detuning of the radio-frequency reception coil should be specified by the following properties:

a) It must be suitable for employment in the strong magnetic basic field of the nuclear magnetic resonance tomography apparatus.

b) It must be able to switch adequately fast so that the high repetition rates required for imaging in nuclear magnetic resonance tomography are possible.

c) The switch element must be voltage-stable up to approximately 500 V and above.

d) The resistance in the through-connected state (ON resistance) should be very low, particularly far lower then 1Ω, so that the signal-to-noise ratio (S/N) of the radio-frequency reception coil is not negatively influenced.

e) The switch element should guarantee a high service life having at least $10^8$ obtainable switching cycles.

All of these specifications can be met extremely well with an electrostatic relay or an electrostatic switch.

Preferably, a conductor loop is electrically closed or interrupted for activating or for deactivating the radio-frequency coil.

The detuning of the radio-frequency reception coil with the electrostatic relay has a number of significant advantages:

a) Since no current, or no significant current, flows in the detuning circuit in the detuned case, the relay need not necessarily be implemented power-resistant or integrated in a power-resistant manner; rather, it merely has to be voltage stable. As a result, the manufacturability of a detuning circuit is facilitated.

b) Since no significant current flows in the detuning circuit in the detuned state, no heating that is unpleasant or technologically disadvantageous for the patient occurs.

c) Since no current flows in the detuned state, there are also no local distortions in the radio-frequency transmission field that could lead to image artifacts and to a jeopardization of the patient.

d) The detuning circuit is not resonant, so that the risk of coupling with other resonant circuits in the nuclear magnetic resonance tomography apparatus is overcome.

e) As a consequence of the smaller dimensions given a micro-mechanical implementation of the electrostatic relay, the advantage also is achieved that the space needed for the detuning circuit is reduced. This is particularly advantageous when the radio-frequency reception coil is a local reception antenna that the medical personnel must attach to the region under examination in the patient. Due to the reduced space requirement, such a coil can be constructed in a more ergonomic fashion.

The above object directed to a nuclear magnetic resonance tomography apparatus is inventively achieved in a magnetic resonance tomography apparatus of the type initially described wherein the switch element is fashioned as an electrostatic relay.

The relay is preferably a micro-mechanical relay that, in particular, is at least partially manufactured by a material erosion technique, for example by etching, from a substrate, particularly from a silicon substrate.

The advantages cited for the inventive employment of such an electrostatic relay analogously apply to the inventive magnetic resonance tomography apparatus. The same is true of the preferred embodiments of the electrostatic relay that were cited in conjunction with the inventive employment.

In a preferred embodiment, the relay is allocated to the radio-frequency coil such that the radio-frequency coil is deactivated or detuned given an interrupted relay.

The radio-frequency coil can be a radio-frequency transmission coil. Preferably, the radio-frequency coil is a radio-frequency reception coil.

The relay can be connected in an electrical high-frequency line leading to the radio-frequency coil.

Given integration of the relay in the high-frequency line, the relay can be employed to replace the previously employed, resonant sheath wave inhibitors. Instead of a sheath wave inhibitor, two electrostatic relays are utilized that completely separate a coaxial high-frequency cable during the transmission phase.

In a preferred embodiment, the relay is arranged within a conductor loop of the radio-frequency coil such that the conductor loop is interrupted when the relay is opened, i.e. when the relay contacts are open.

In order to increase the dielectric strength, it is expedient to connect at least one further electrostatic relay within the conductor loop, with the two electrostatic relays connected in series.

A number of electrostatic relays connected in parallel are provided for advantageously reducing the volume resistance.

In an electrostatic relay, the layer electrodes that produce the electrostatic attractive force are charged with a constant voltage. A constant voltage source is allocated to the electrostatic relay for this purpose.

Preferably, a drive unit is provided for generating a switching event in the relay, the drive unit having the constant voltage source allocated to it, and the relay being charged with the constant voltage thereof when driven by the drive unit.

A monitoring unit for measuring an electrical current flowing through contact pieces of the relay can be provided. For example, the monitoring unit can charge the relay with a constant current. By measuring this current, it can be recognized whether the relay opens during the transmission phase and thus detunes the radio-frequency reception coil.

Preferably, the monitoring unit generates an error signal when the current exceeds a threshold. Given employment of the electrostatic relay for detuning the radio-frequency reception coil, the error signal is generated only when the measurement cycle in the nuclear magnetic resonance tomography apparatus passes through a radio-frequency transmission phase at the moment. The error signal indicates whether the switch opens during the transmission phase. When this is not the case, the measurement can be aborted. Such an error signal can be so reliably generated that melt fuses as radio-frequency current limiting units, as were hitherto employed for patient protection, can be foregone. The lossy melt fuses degrade the signal-to-noise ratio in the reception signal. Foregoing the melt fuses thus leads to improvement of the signal-to-noise ratio.

An inductor coil is preferably connected in parallel with the electrostatic relay that is employed. As a result, a residual capacitance of the micro-mechanical relay can be compensated and the behavior of the relay given opened relay contacts is thus improved.

For shortening the switching time, it is also advantageous to drive the electrostatic relay with a dynamically regulated DC voltage. An elevated DC voltage is applied for initiating the switching event, this being reduced to a lower value subsequently during a holding phase wherein the switch remains closed.

The above object is also achieved in accordance with the principles of the present invention in a magnetic resonance imaging apparatus having a radio-frequency system with a system status which must be altered during an MR scan, and wherein an electrostatic relay is connected in the RF system, with the electrostatic relay being switched during an MR scan to alter the status of the RF system.

The aforementioned advantages and embodiments related to the relay, as well as those related to the initially described magnetic resonance tomography apparatus, apply as well to this version of a tomography apparatus.

DESCRIPTION OF THE PREFERRED EMBODIMENTS

Figure 1:
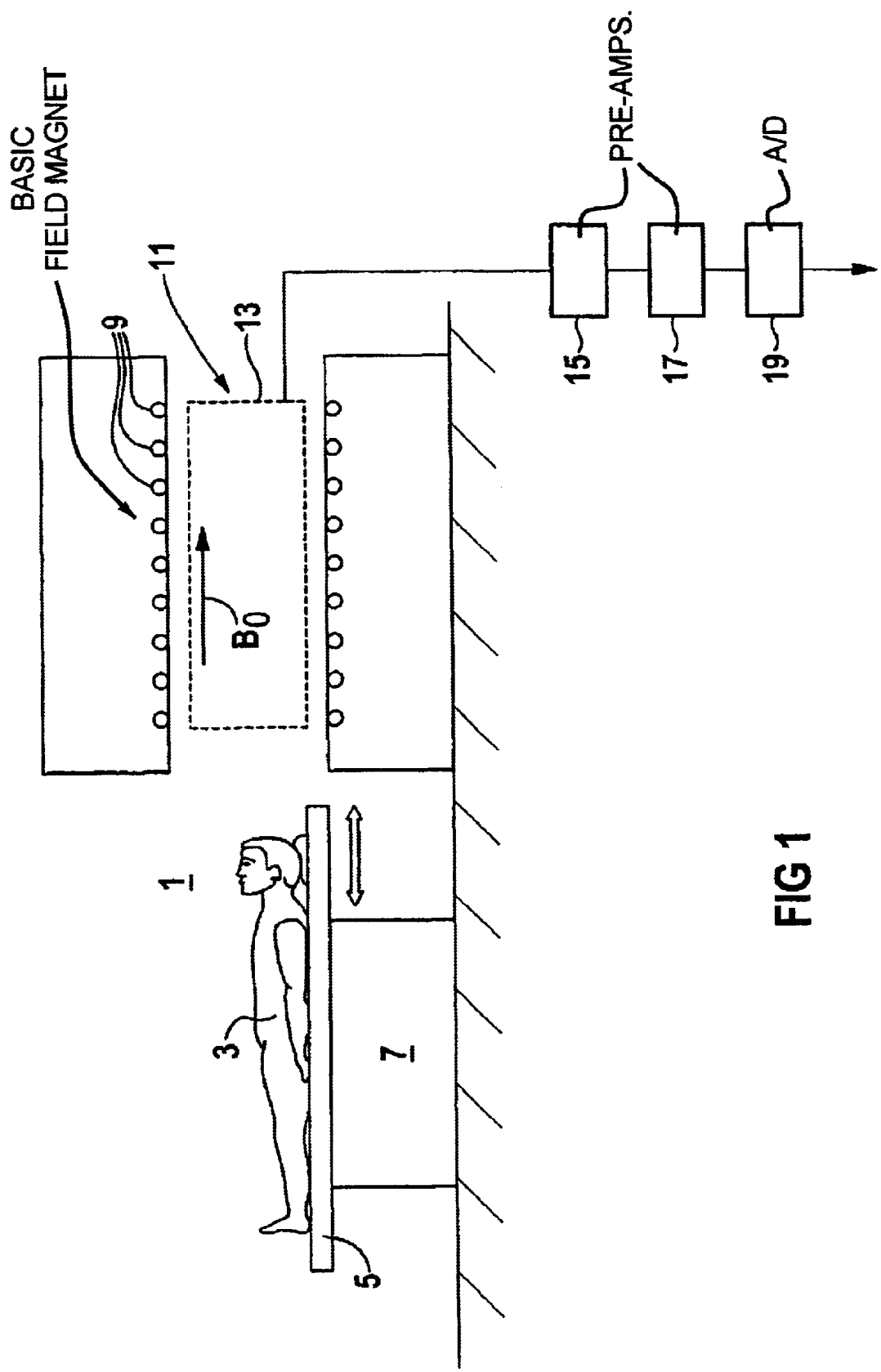
FIG. 1 is a block diagram of a magnetic resonance tomography apparatus constructed and operating according to the invention.

FIG. 1 shows a magnetic tomography apparatus (referenced 1 overall) with which a region of a patient 3 is to be examined by imaging. The patient 3 is shown in a condition before the beginning of the examination wherein the patient is placed on a horizontally displaceable bed 5 that is carried by a support 7.

The magnetic resonance tomography apparatus 1 has a basic field magnet 9 for generating a horizontal magnetic basic field $B_0$ that is largely constant in time and in space in an opening 11. For the examination, the patient 3 is horizontally displaced and introduced into the opening 11. A radio-frequency coil 13 (which is only schematically indicated) is arranged in the opening 11. The radio-frequency coil 13 is connected via coaxial cables to a pre-amplifier 15 that is in turn in communication with a pre-amplifier 17 and a following analog-to-digital converter 19. The digital values generated by the analog-to-digital converter 19 are utilized for the formation of a raw data matrix that is the basis for an image-reconstructing Fourier transformation.

Figure 2:
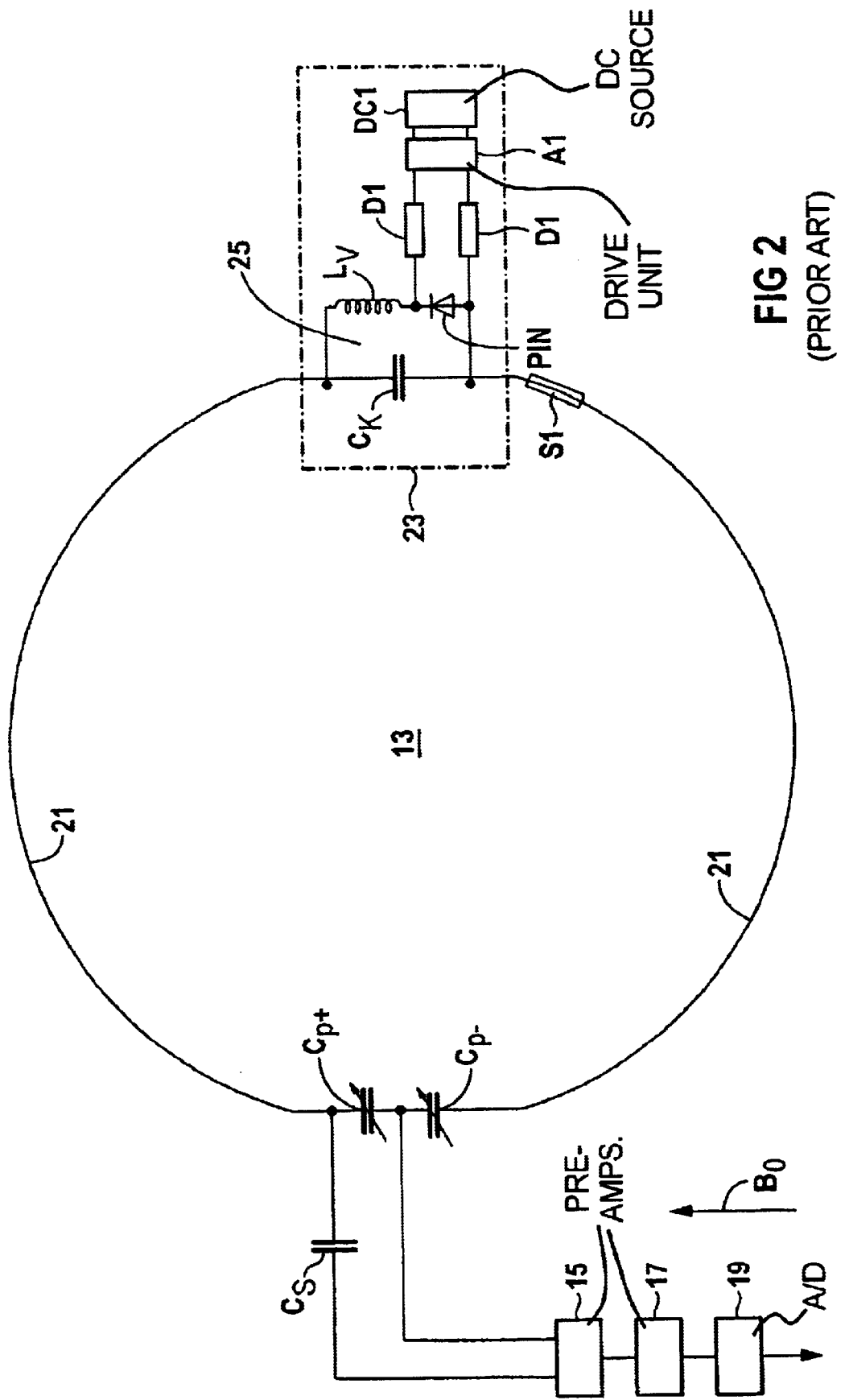
FIG. 2 shows a radio-frequency reception coil for a magnetic resonance tomography apparatus according to the prior art.

FIG. 2 shows the radio-frequency coil 13 in the way by which it was operated according to the prior art. A matching capacitor $C_s$ serves the purpose of impedance matching of the radio-frequency coil 13 to the high-frequency line coming from the pre-amplifier. The resonant frequency of the radio-frequency coil 13 can be set to the "frequency of the nuclear magnetic resonance tomograph", i.e. to the Larmor frequency employed, by means of two tuning capacitors $C_{p^-}$, $C_{p'}$. The radio-frequency coil 13 according to FIG. 2 is employed as reception antenna. It receives a radio-frequency field whose magnetic component is oriented perpendicular to the plane of the drawing, i.e. perpendicular to the basic field $B_0$.

A detuning circuit 23 is integrated into a reception antenna circuit or into a conductor loop 21 of the radio-frequency coil 13. The detuning circuit 23 has a shortening capacitor $C_K$ arranged in the conductor loop 21 with which a series-connected PIN diode PIN and detuning inductance $L_V$ (coil) is connected in parallel. A (switched) DC source DC1 supplies a direct current controlled by a drive unit A1 to the PIN diode PIN via two inductor coils D1 for charging the PIN diode PIN with a direct current of approximately 100–200 mA.

The PIN diode PIN acts as radio-frequency switch. In the reception phase of the nuclear magnetic resonance tomography apparatus 1, the PIN diode PIN is blocked by applying a high blocking voltage of approximately −30 V, and the radio-frequency coil 13 is in the tuned state as a result. In a transmission phase of the magnetic resonance tomography apparatus 1, the PIN diode PIN is charged with a direct current and thereby acts as a closed switch. In this through-connected condition, the detuning coil or detuning inductance $L_V$ is connected in parallel with the shortening capacitor $C_K$ with the PIN diode PIN. The resulting parallel resonant circuit 25 is tuned to the Larmor frequency of the magnetic resonance tomography apparatus 1 and then acts as a blocking circuit. On the basis of this blocking circuit, the current in the radio-frequency coil 13 acting as antenna is minimized in the transmission phase.

A melt fuse S1 is integrated into the conductor loop 21 for patient protection given a failure of the PIN diode PIN during the transmission phase.

Figure 3:
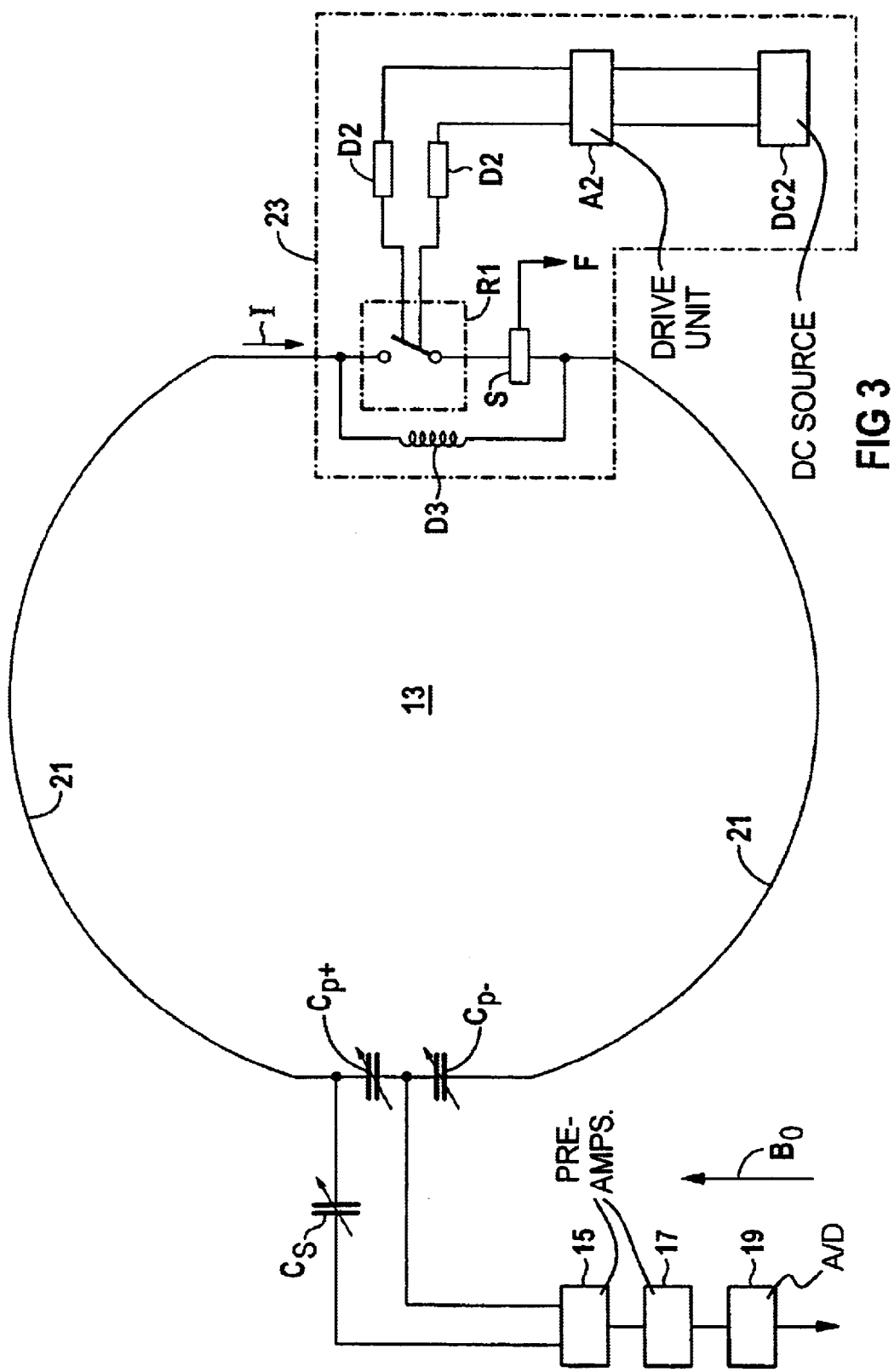
FIG. 3 shows a radio-frequency reception coil of the magnetic resonance tomography apparatus of the invention.

FIG. 3 shows the radio-frequency coil of the magnetic resonance tomography apparatus according to FIG. 1 with a detuning circuit 23 of the invention. Only the differences with respect to the embodiment according to FIG. 2 shall be discussed below. An electrostatic relay R1 is installed directly into the conductor loop 21 as part of the detuning circuit 23. The relay R1 can be charged with the DC voltage of a DC voltage source DC2. A drive unit A2 that is in communication with the relay R1 via inductor coils D2 is present for controlled charging of the DC voltage, i.e. for generating a switching event. Due to the charging of the relay R1 with said DC voltage, a switching event can be generated in the relay R1, and thus changing the radio-frequency coil 13 between a detuned state and a non-detuned state can be achieved.

A shortening capacitor is not required. As a result, a shortening of the coil inductance is advantageously avoided, as particularly occurs given low frequencies below 40 MHZ.

An inductor coil D3 is connected in parallel with the relay R1 for the compensation of a residual capacitance of the relay R1.

Figure 7:
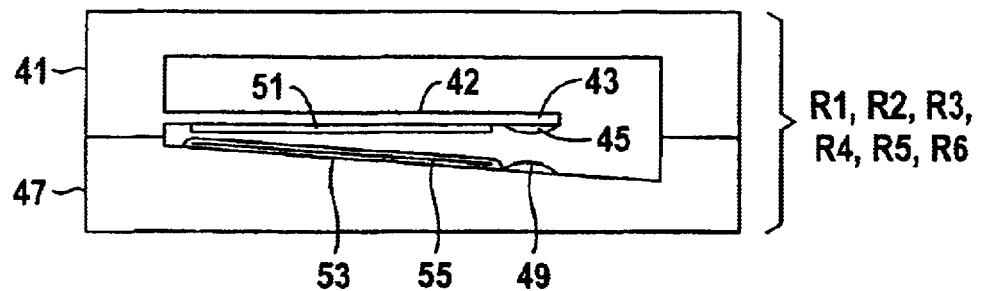
FIG. 7 illustrates the basic schematic structure of an electrostatic relay for employment according to the invention.

The detuning circuit 23 has a monitoring unit S that measures a direct current flowing through contacts 45, 49 (See FIG. 7). As a result of this current 1, it can be recognized whether the relay R1 or the switch opens during the transmission cycle. When this is not the case, an error signal F is output and the measurement is aborted. The monitoring unit S serves the purpose of patient protection.

The relay has the following properties:

| | |
|---|---|
| Nominal voltage: | <24 V |
| Response voltage: | <15 V |
| Recoil voltage: | approximately 10 V |
| Contact resistance: | <1 Ω |
| Drive power: | <7 μW at 100 Hz |
| Dielectric strength: | >500 V |
| Switching time: | approximately 200 μsec |
| Dimensions: | 4 × 3 × 1.5 mm$^3$ |

Figure 4:
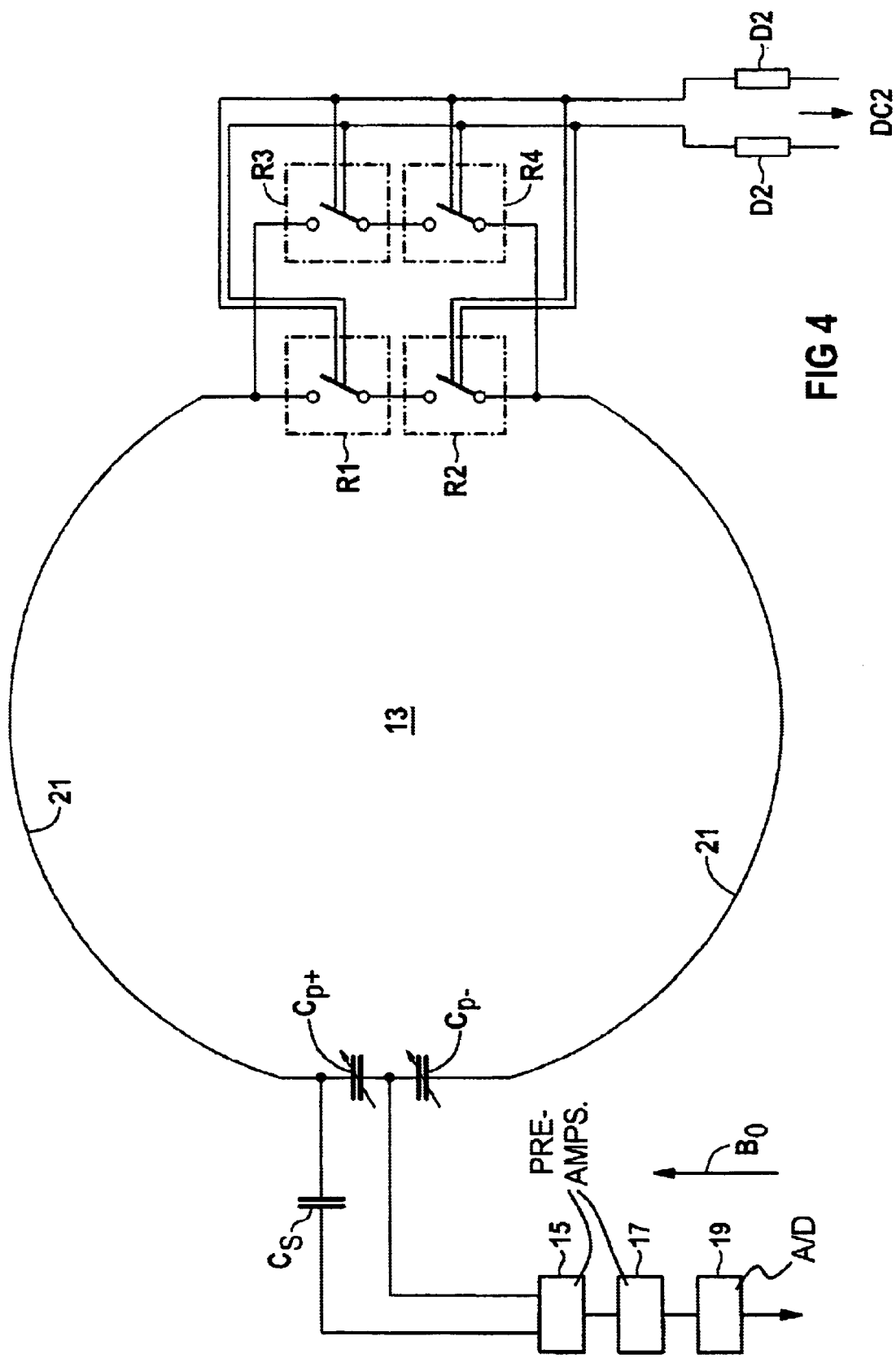
FIG. 4 shows a radio-frequency reception coil of a further embodiment of the magnetic resonance tomography apparatus of the invention.

FIG. 4 shows another exemplary embodiment of a radio-frequency coil 13 of the magnetic resonance tomography apparatus 1 that is largely identical with the example of FIG. 3. For increasing the voltage strength, however, respectively two electrostatic relays R1, R2 are connected in series and R3, R4 are connected in series. For reducing the through resistance, the two relay pairs R1, R2 and R3, R4 are connected in parallel. Moreover, the drive of the relays R1, R2, R3, R4 as well as their monitoring occur in conformity with the exemplary embodiment according to FIG. 3.

Figure 5:
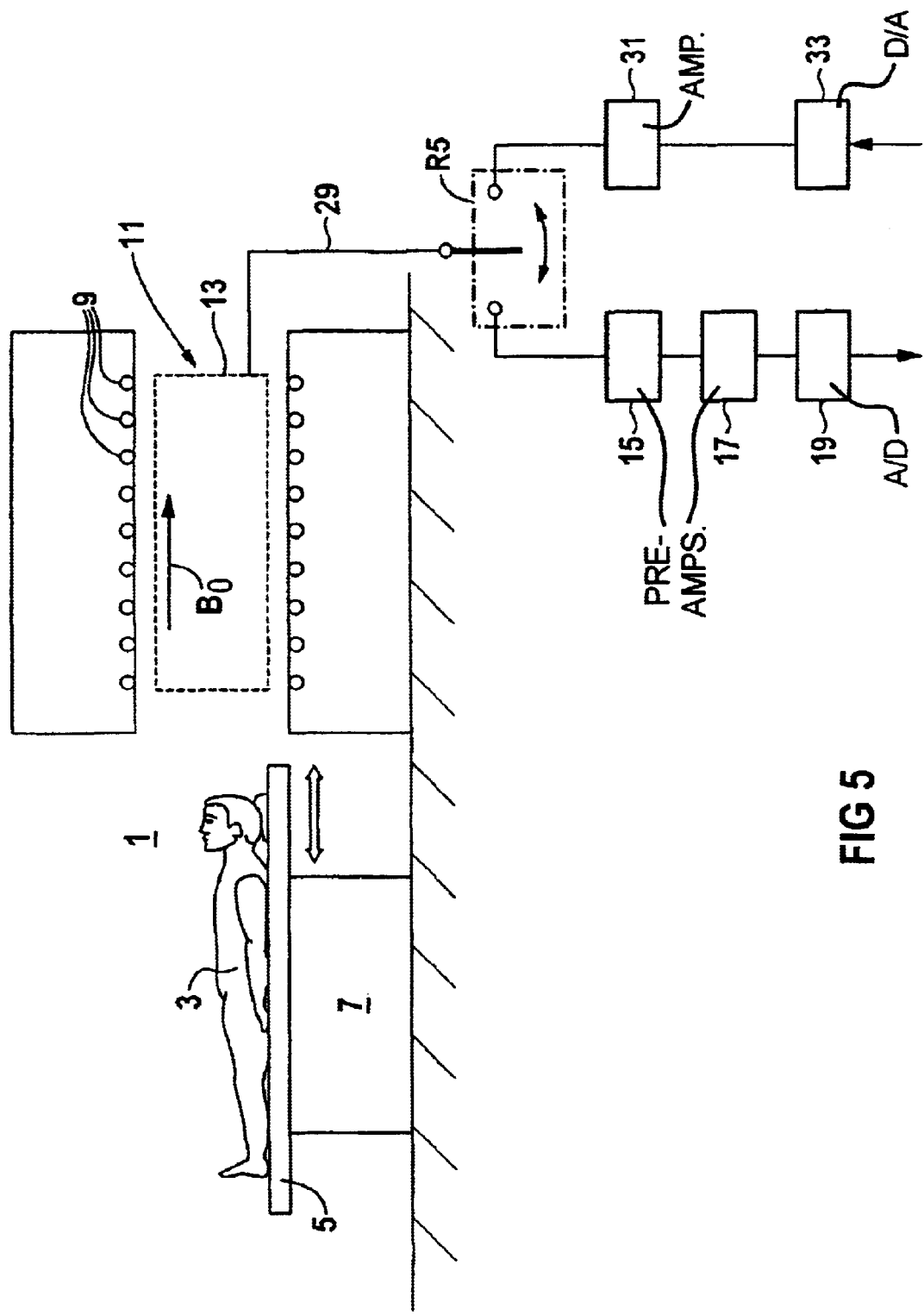
FIG. 5 shows the magnetic resonance tomography apparatus of the invention with a radio-frequency coil that serves both for transmission and for reception.

FIG. 5 represents an application of the electrostatic relay R5 wherein it is not integrated into a conductor loop 21 but into a high-frequency line 29. It thereby causes a switching of the radio-frequency coil 13 that, in this example, serves both for transmission as well for reception, between a reception channel formed by the aforementioned components 15, 17 and 19 and a transmission channel having a power amplifier 31 and a digital-to-analog converter 33.

Figure 6:
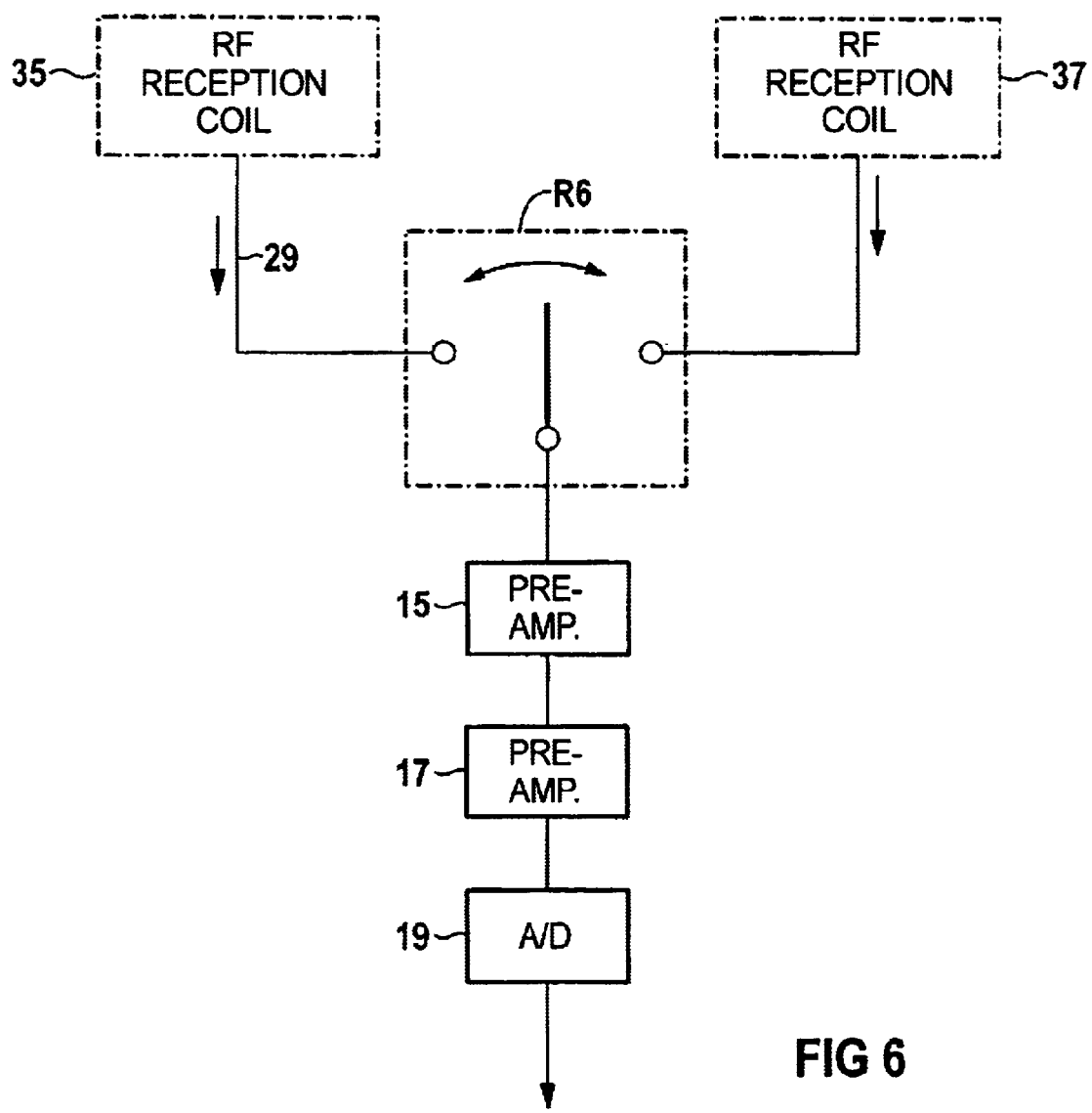
FIG. 6 is a block diagram of the drive components for two radio-frequency reception coils of a magnetic resonance tomography apparatus of the invention.

For employment of the electrostatic relay R6 shown in FIG. 6, two radio-frequency reception coils 35, 37 are present. For example, one of the radio-frequency reception coils is a local coil and another is a stationary coil. An electrostatic, micro-mechanical relay R6 is employed for demultiplexing the reception signals of the two radio-frequency reception coils 35, 37 on the reception channels 15, 17, 19.

FIG. 7 shows the basic structure of a micro-mechanical electrostatic relay serving as any of the relays R1, R2, R3, R4, R5, R6 as utilized in the magnetic resonance tomography apparatus 1 of the invention. It has a carrier member or a substrate 41 of boron-doped silicon having a height of approximately 0.5 mm. A cavity 42 is formed in the substrate 41 by etching, so that a thin, flat armature 43 projects. The armature 43 has a contact 45 at its end.

A cooperating contact 49 is applied to a cooperating piece 47 composed, for example, of glass. The armature 43 is housed by the substrate 41 and the cooperating piece 47. A first gold electrode 51 is applied to the underside of the armature 43 and a second gold electrode 53 is applied to the upper side of the cooperating piece 47. The second gold electrode 53 is covered with a thin insulating layer 55. By applying a DC voltage—with leads that are not explicitly shown—to the electrodes 51, 53, the armature 43 with its contact 45 is drawn downwardly as a consequence of the different polarity and the electrostatic field that is generated until the contact 45 comes into contact with the cooperating contact 49 and implements a desired switching event (through-connected condition).

Figure 8:
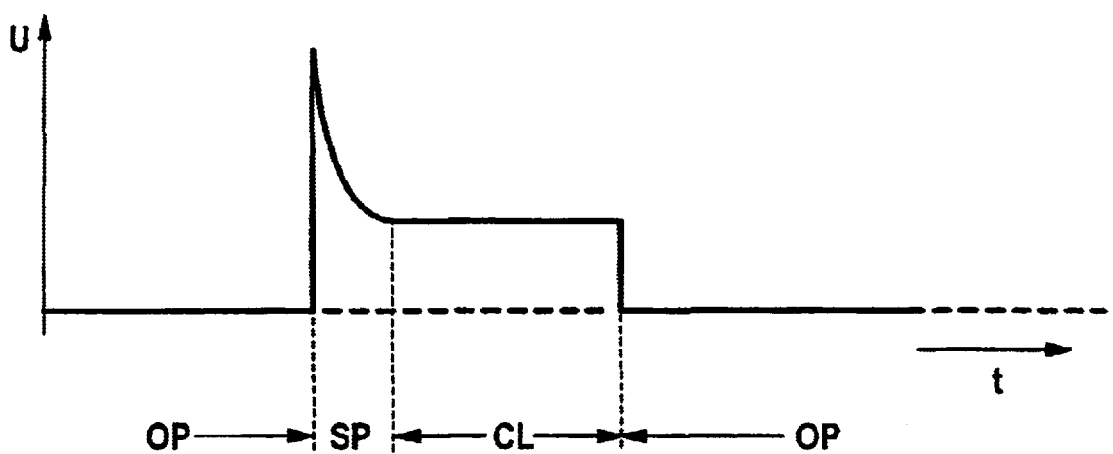
FIG. 8 is a time curve of a preferred manner of operating of the electrostatic relay in accordance with the invention.

FIG. 8 shows a dynamically regulated drive of an electrostatic relay which exhibits an especially short switching time. The curve of the DC voltage U over the time t is shown. In the phase OP, the relay is open. For achieving the "closed" condition, the voltage U passes through a switching phase SP with an elevated voltage value before a lower holding voltage for keeping the relay closed is applied in the phase CL.

Although modifications and changes may be suggested by those skilled in the art, it is in the intention of the inventors to embody within the patent warranted hereon all changes and modifications as reasonably and properly come within the scope of their contribution to the art.

We claim as our invention:

1. A method for operating a magnetic resonance imaging apparatus comprising the steps of:
   providing a magnetic resonance scanner which has a radio-frequency system having a system status which must be altered during a magnetic resonance scan;
   connecting an electrostatic relay in said radio-frequency system; and
   during said magnetic resonance scan, altering said status of said radio-frequency system by switching said electrostatic relay.

2. A method as claimed in claim 1 comprising employing a micro-mechanical relay as said electrostatic relay.

3. A method as claimed in claim 2 comprising manufacturing said micro-mechanical relay by a material erosion technique.

4. A method as claimed in claim 3 comprising manufacturing said micro-mechanical relay by etching a substrate.

5. A method as claimed in claim 4 comprising manufacturing said micro-mechanical relay by etching a silicon substrate.

6. A method as claimed in claim 1 wherein said radio-frequency system comprises a radio-frequency coil and wherein the step of altering said status of said radio-frequency system by switching said electrostatic relay comprises switching said radio-frequency coil between an activated status and a deactivated status by switching said electrostatic relay.

7. A method as claimed in claim 6 comprising employing said radio-frequency coil as a reception coil during said magnetic resonance scan.

8. A method as claimed in claim 7 comprising, during said magnetic resonance scan, emitting a radio-frequency pulse into a subject, and wherein the step of deactivating said radio-frequency coil comprises deactivating said radio-frequency coil by switching said electrostatic relay before emitting said radio-frequency pulse.

9. A method as claimed in claim 1 wherein said radio-frequency system comprises a radio-frequency coil, and wherein the step of altering said status of said radio-frequency system comprises de-tuning said radio-frequency coil by switching said electrostatic relay at a time during said magnetic resonance scan.

10. A method as claimed in claim 1 wherein said radio-frequency system comprises a radio-frequency coil connected in a conductor loop, and wherein the step of connecting said electrostatic relay in said radio-frequency system comprises connecting said electrostatic relay in said conductor loop, and wherein the step of altering said status of said radio-frequency system by switching said electrostatic relay comprises closing said conductor loop to activate said radio-frequency coil and opening said conductor loop to deactivate said radio-frequency coil during said magnetic resonance scan.

11. A method as claimed in claim 1 wherein said radio-frequency system comprises a plurality of radio-frequency reception coils which generate respective reception signals during said magnetic resonance scan, and wherein the step of altering said radio-frequency system by switching said electrostatic relay comprises demultiplexing said reception signals during said magnetic resonance scan.

12. A method as claimed in claim 1 wherein said radio-frequency system comprises a plurality of radio-frequency transmission coils operated by respective control signals, and wherein the step of altering said status of said radio-frequency system by switching said electrostatic relay comprises multiplexing said control signals during said magnetic resonance scan.

13. A magnetic resonance imaging apparatus comprising:
providing a magnetic resonance scanner which has a radio-frequency system having a system status which must be altered during a magnetic resonance scan;
an electrostatic relay connected in said radio-frequency system; and
a drive unit connected to said electrostatic relay for, during said magnetic resonance scan, altering said status of said radio-frequency system by switching said electrostatic relay.

14. A magnetic resonance imaging apparatus as claimed in claim 13 wherein said electrostatic relay is a micro-mechanical relay.

15. A magnetic resonance imaging apparatus as claimed in claim 14 wherein said micro-mechanical relay is manufactured by a material erosion technique.

16. A magnetic resonance imaging apparatus as claimed in claim 15 wherein said micro-mechanical relay has a substrate and by etching said substrate.

17. A magnetic resonance imaging apparatus as claimed in claim 16 wherein said substrate is a silicon substrate.

18. A magnetic resonance imaging apparatus as claimed in claim 13 wherein said radio-frequency system comprises a radio-frequency coil and wherein said drive unit alters said status of said radio-frequency system by switching said electrostatic relay to switch said radio-frequency coil between an activated status and a deactivated status by switching said electrostatic relay.

19. A magnetic resonance imaging apparatus as claimed in claim 18 wherein said radio-frequency coil is a reception coil during said magnetic resonance scan.

20. A magnetic resonance imaging apparatus as claimed in claim 19 wherein said magnetic resonance scanner, during said magnetic resonance scan, emits a radio-frequency pulse into a subject, and wherein said drive unit deactivates said radio-frequency coil by switching said electrostatic relay before said radio-frequency pulse is emitted.

21. A magnetic resonance imaging apparatus as claimed in claim 13 wherein said radio-frequency system comprises a radio-frequency coil, and wherein said drive unit alters said status of said radio-frequency system by de-tuning said radio-frequency coil by switching said electrostatic relay at a time during said magnetic resonance scan.

22. A magnetic resonance imaging apparatus as claimed in claim 13 wherein said radio-frequency system comprises a radio-frequency coil connected in a conductor loop, and wherein said electrostatic relay is connected in said conductor loop, and wherein said drive unit alters said status of said radio-frequency system by switching said electrostatic relay to close said conductor loop to activate said radio-frequency coil and to open said conductor loop to deactivate said radio-frequency coil during said magnetic resonance scan.

23. A magnetic resonance imaging apparatus as claimed in claim 13 wherein said relay, said drive unit comprises a constant voltage source supplied to said electrostatic relay when said electrostatic relay is operated by said drive unit.

24. A magnetic resonance imaging apparatus as claimed in claim 13 wherein said electrostatic relay has contacts between which electrical current flows, and wherein said magnetic resonance imaging apparatus further comprises a measuring unit connected to said electrostatic relay for measuring said electrical current flowing through said contacts.

25. A magnetic resonance imaging apparatus as claimed in claim 24 wherein said monitoring unit generates an error signal if said electrical current exceeds a threshold.

26. A magnetic resonance imaging apparatus as claimed in claim 13 further comprising an inductor coil connected in parallel with said electrostatic relay.

27. A magnetic resonance imaging apparatus comprising:
a magnetic resonance scanner having a radio-frequency system containing a plurality of radio-frequency transmission coils respectively supplied with control signals during a magnetic resonance scan;
at least one electrostatic relay connected between said plurality of radio-frequency transmission coils and a source of said control signals, said electrostatic relay being operated during said magnetic resonance scan to multiplex said control signals.

28. A magnetic resonance imaging apparatus as claimed in claim 27 wherein said electrostatic relay is a micro-mechanical relay.

29. A magnetic resonance imaging apparatus as claimed in claim 28 wherein said micro-mechanical relay is manufactured by a material erosion technique.

30. A magnetic resonance imaging apparatus as claimed in claim 29 wherein said micro-mechanical relay has a substrate and by etching said substrate.

31. A magnetic resonance imaging apparatus as claimed in claim 30 wherein said substrate is a silicon substrate.

32. A magnetic resonance imaging apparatus comprising:
a magnetic resonance scanner having a radio-frequency system having a plurality of radio-frequency reception coils which generate respective reception signals during a magnetic resonance scan; and
at least one electrostatic relay connected to said plurality of radio-frequency reception coils for demultiplexing said reception signals during said magnetic resonance scan.

33. A magnetic resonance imaging apparatus as claimed in claim 32 wherein said electrostatic relay is a micro-mechanical relay.

34. A magnetic resonance imaging apparatus as claimed in claim 33 wherein said micro-mechanical relay is manufactured by a material erosion technique.

35. A magnetic resonance imaging apparatus as claimed in claim 34 wherein said micro-mechanical relay has a substrate and by etching said substrate.

36. A magnetic resonance imaging apparatus as claimed in claim 35 wherein said substrate is a silicon substrate.

* * * * *